United States Patent [19]

Fukushi et al.

[11] Patent Number: 4,890,018
[45] Date of Patent: Dec. 26, 1989

[54] BIPOLAR-COMPLEMENTARY METAL OXIDE SEMICONDUCTOR CIRCUIT

[75] Inventors: Isao Fukushi, Yokohama; Takahisa Muroi, Kawasaki, both of Japan

[73] Assignees: Fujitsu Limited, Kawasaki; Fujitsu VLSI Limited, Kasugai, both of Japan

[21] Appl. No.: 269,417

[22] Filed: Nov. 10, 1988

[30] Foreign Application Priority Data

Nov. 16, 1987 [JP] Japan ................................ 62-288728

[51] Int. Cl.⁴ ........................................... H03K 17/04
[52] U.S. Cl. .................................. 307/446; 307/443; 307/570; 307/317.1
[58] Field of Search ............... 307/443, 446, 451, 454, 307/570, 300, 303.2, 317.1

[56] References Cited

U.S. PATENT DOCUMENTS

| | | | |
|---|---|---|---|
| 4,661,723 | 4/1987 | Masuda et al. | 307/446 |
| 4,678,943 | 7/1987 | Uragami et al. | 307/446 X |
| 4,694,202 | 9/1987 | Iwamura et al. | 307/446 X |
| 4,733,110 | 3/1988 | Hara et al. | 307/446 |
| 4,746,817 | 5/1988 | Banker et al. | 307/570 X |
| 4,804,869 | 2/1989 | Masuda et al. | 307/446 |
| 4,808,850 | 2/1989 | Masuda et al. | 307/451 X |
| 4,839,537 | 6/1989 | Ueno | 307/443 X |
| 4,845,385 | 7/1989 | Ruth, Jr. | 307/443 X |
| 4,845,386 | 7/1989 | Ueno | 307/443 X |

FOREIGN PATENT DOCUMENTS

| | | | |
|---|---|---|---|
| 0196625 | 11/1984 | Japan | 307/446 |
| 0141018 | 7/1985 | Japan | 307/446 |
| 102621 | of 1987 | Japan . | |
| 169520 | of 1987 | Japan . | |

OTHER PUBLICATIONS

"TTL Level High Speed BIFET Receiver", *IBM T.D.B.*, vol. 30, No. 8, Jan. 1988, pp. 394–395.

*Primary Examiner*—David Hudspeth
*Attorney, Agent, or Firm*—Staas & Halsey

[57] ABSTRACT

A bipolar-complementary metal oxide semiconductor circuit includes a p-channel MOS transistor, and an n-channel MOS transistor, first and second bipolar transistors. A base of the first bipolar transistor is connected to a negative power source through the n-channel MOS transistor. A diode is connected to the base and emitter of the first bipolar transistor. The diode functions to prevent a reverse-biased voltage exceeding a base-emitter breakdown voltage from being applied between the base and emitter of the first bipolar transistor.

10 Claims, 5 Drawing Sheets (a)

(b)

FIG. 5
FIG. 8
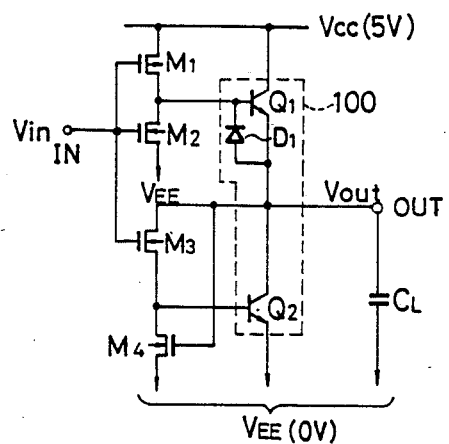
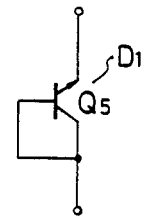
FIG. 6
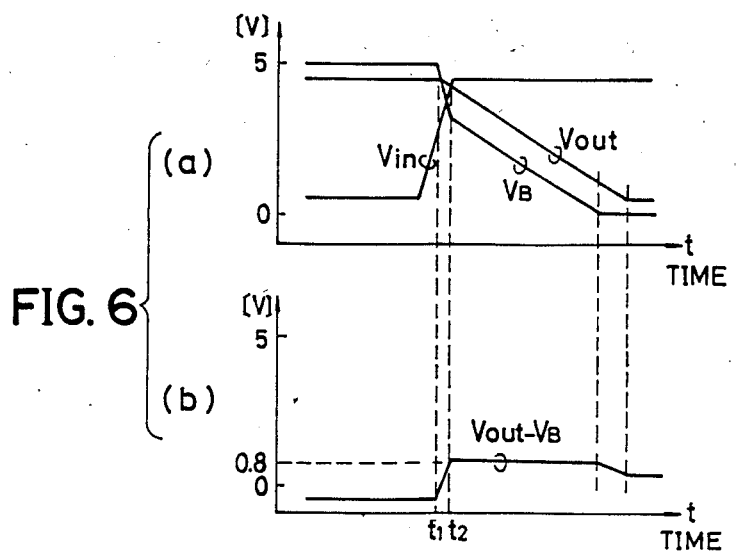

BIPOLAR-COMPLEMENTARY METAL OXIDE SEMICONDUCTOR CIRCUIT

BACKGROUND OF THE INVENTION

The present invention generally relates to a bipolar-complementary metal oxide semiconductor circuit, and more particularly to an improvement of a circuit structure of a bipolar-complementary metal oxide semiconductor circuit.

Recently, there has been considerable activity in the development of a bipolar-complementary metal oxide semiconductor circuit (hereinafter simply referred to as a Bi-CMOS circuit). It is well known that CMOS circuits have advantages of high integration density and low power consumption. On the other hand, bipolar transistor circuits have advantages of high driving capability and high mutual conductance. Bi-CMOS circuits have the advantages of both the CMOS circuit and bipolar transistor circuit. A Bi-CMOS circuit includes a logic circuit portion composed of CMOS transistors and a load driving circuit portion composed of two bipolar transistors. A first bipolar transistor of the load driving portion is used for charging up a capacitive load connected thereto. A second bipolar transistor of the load driving portion is used for discharging the capacitive load.

Currently, two types of Bi-CMOS circuits are known. In a first type of Bi-CMOS circuit, when the first bipolar transistor is turned OFF, a base thereof becomes connected to a negative power source through a current path for supplying the second bipolar transistor with a base current produced by a charge stored in the capacitive load connected to the Bi-CMOS circuit. In the second type of Bi-CMOS circuit, when the first bipolar transistor is turned OFF, the base thereof becomes connected to the negative power source through an n-channel MOS transistor which is a part of a complementary MOS inverter in the logic circuit.

However, the conventional Bi-CMOS circuit of the first type has a disadvantage described below. When the first bipolar transistor is turned OFF, a reverse-biased voltage is applied between the emitter and base thereof. This is because the base voltage of the first bipolar transistor quickly decreases to a negative power source voltage, compared with a decrease of the emitter voltage of the first bipolar transistor. When the reverse-biased voltage exceeds a base-emitter breakdown voltage of the first bipolar transistor, it may be damaged.

SUMMARY OF THE INVENTION

It is therefore a general object of the present invention to provide a novel and useful Bi-CMOS circuit in which the aforementioned disadvantage is eliminated.

A more specific object of the present invention is to provide a Bi-CMOS circuit having a function of preventing a reverse-biased voltage higher than a base-emitter breakdown voltage from being applied between the base and emitter of a bipolar transistor used for charging up a capacitive load connected thereto.

Another object of the present invention is to provide a Bi-CMOS circuit in which the application of the reverse-biased voltage exceeding the base-emitter breakdown voltage can be effectively provided with a slight increase of a pattern area on a semiconductor chip.

The above objects of the present invention can be achieved by a Bi-CMOS circuit comprising first and second power sources; a logic circuit comprising first and second metal oxide semiconductor (MOS) transistors serially connected between the first and second power sources, an input signal being applied to gates of the first and second MOS transistors; a first bipolar transistor having a collector coupled to the first power source and a base coupled to a connecting point between the first and second MOS transistors; a second bipolar transistor having an emitter coupled to the second power source and a collector coupled to the emitter of the first bipolar transistor and used as an output terminal of the circuit; a third MOS transistor connected between a base of the second bipolar transistor and the output terminal of the circuit, a gate of the third MOS transistor being supplied with the input signal; and a diode having an anode connected to the emitter of the first bipolar transistor and a cathode connected to the base of the first bipolar transistor.

Other objects, features and advantages of the present invention will become apparent from the following detailed description when read in conjunction with the accompanying drawings.

BRIEF DESCRIPTION OF THE DRAWINGS

FIG. 5 is a circuit diagram of a first preferred embodiment of the present invention;

FIG. 6 is a waveform diagram of signals in the preferred embodiment of FIG. 5;

FIG. 8 is a circuit diagram of a diode shown in FIG. 5; and

DESCRIPTION OF THE PREFERRED EMBODIMENTS

To facilitate the understanding of the present invention, a description is given of conventional Bi-CMOS circuits with reference to FIGS. 1 through 4.

Figure 1:
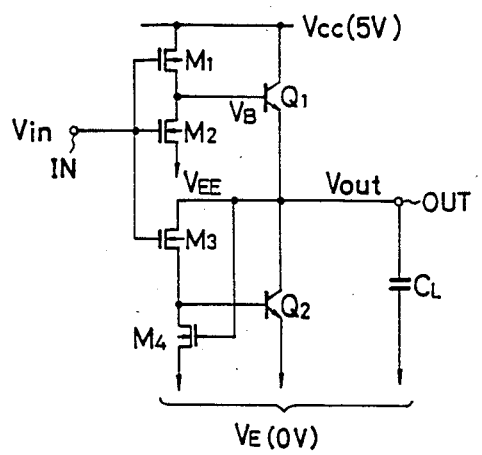
FIG. 1 is a circuit diagram of a conventional Bi-CMOS circuit.

FIG. 1 is a conventional Bi-CMOS circuit of the first type. The illustrated circuit forms a NOT gate. An npn-type bipolar transistor Q1 is used for charging up a capacitive load $C_L$ to approximately a positive power source voltage $V_{CC}$ (5 volts). An npn-type bipolar transistor Q2 is used for discharging the capacitive load $C_L$. A CMOS inverter is constructed by a p-channel MOS transistor M1 and an n-channel MOS transistor M2. The CMOS inverter controls the ON/OFF state of the bipolar transistor Q1. An n-channel MOS transistor M3 is used for controlling the ON/OFF state of the bipolar transistor Q2, and also for passing a current from the capacitive load $C_L$ therethrough when an input signal $V_{in}$ applied to an input terminal IN is switched from a low level to a high level. An n-channel MOS transistor M4 is used for discharging a base capacitor of the bipolar transistor Q2.

When the input signal Vin is switched from high level to low level, the MOS transistor M1 is turned ON and the bipolar transistor Q1 is turned ON so that an output voltage Vout becomes high level. According to the increase of the output voltage Vout, the MOS transistor M4 is turned ON so as to make the bipolar transistor Q2 turn OFF by discharging the base capacitor of the bipolar transistor Q2.

When the input signal $V_{in}$ is switched to high level, the MOS transistor M2 is turned ON. Thereby, the bipolar transistor Q1 is turned OFF. At this time, the MOS transistor M3 is also turned ON. Therefore a current passes from the capacitive load $C_L$ to a negative power source $V_{EE}$ (a ground level) through the MOS transistors M3 as a base current of the bipolar transistor Q2. Thereby, the bipolar transistor Q2 is turned ON, and the capacitive load $C_L$ is discharged therethrough. As a result, an output voltage $V_{out}$ at an output terminal OUT becomes zero.

Figure 2:
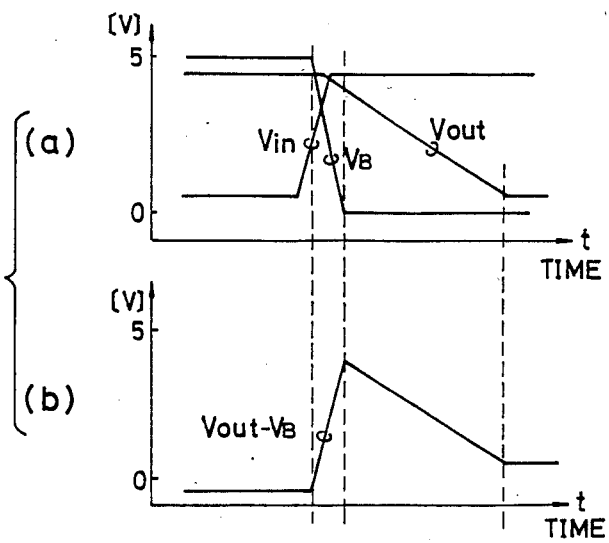
FIG. 2 is a waveform diagram of signals in the Bi-CMOS circuit shown in FIG. 1.

FIG. 2 is a waveform diagram of the input signal $V_{in}$, the output signal $V_{out}$, and the base voltage $V_B$ of the transistor Q1. It can be seen from FIG. 2(a) that when the input signal $V_{in}$ is switched to the high level, the base voltage $V_B$ of the transistor Q1 quickly decreases to the negative power source voltage $V_{EE}$ through the MOS transistor M2. On the other hand, the output signal $V_{out}$ decreases slowly, compared with the decrease of the base voltage $V_B$. This is because the capacitive load $C_L$ is coupled with the output terminal OUT. During the time when the output signal $V_{out}$ decreases, a reverse-biased voltage shown in FIG. 2(b) is applied between the base and emitter of the transistor Q1. The reverse-biased voltage corresponds to a difference between the output signal voltage $V_{out}$ and the base voltage $V_B$. As shown, as the base voltage $V_B$ decreases, the reverse-biased voltage increases. Normally, a bipolar transistor has a breakdown voltage of approximately 3 to 5 volts. Therefore, the reverse-biased voltage causes breakdown of the transistor Q1 when the reverse-biased voltage exceeds the base-emitter breakdown voltage during the discharge of the capacitive load $C_L$.

The present invention intends to overcome the above-mentioned disadvantage.

A description is given of a first preferred embodiment of the present invention with reference to FIG. 5. In FIG. 5, those parts which are the same as those in FIG. 1 are given the same reference numerals.

Referring to FIG. 5, an essential feature of the embodiment of the present invention is the presence of a diode D1 connected between the base and emitter of the transistor Q1. A cathode of the diode D1 is connected to the base of the transistor Q1, and an anode of the diode D1 is connected to the emitter of the transistor Q1. Other portions of the circuit of FIG. 5 are the same as that of the circuit of FIG. 1. That is, the input signal $V_{in}$ is applied to gates of the MOS transistors M1, M2 and M3. The source of the MOS transistor M1 is connected to the positive power source $V_{CC}$, and the drain thereof is connected to the drain of the MOS transistor M2 and the base of the transistor Q1. The source of the MOS transistor M2 is connected to the negative power source $V_{EE}$. The collector of the transistor Q1 is connected to the positive power source $V_{CC}$, and the collector of the transistor Q1 is connected to the emitter of the transistor Q2, the drain of the MOS transistor M3, and the gate of the MOS transistor M4. The output signal $V_{out}$ appears at the collector of the transistor Q2. The source of the MOS transistor M3 is connected to the base of the transistor Q2 and the drain of the MOS transistor M4. The emitter of the transistor Q2 and the source of the MOS transistor M4 are connected to the negative power source $V_{EE}$. The MOS transistor M4 is used for discharging the parasitic base capacitance of the bipolar transistor Q2.

Referring to FIG. 6, after the input signal $V_{in}$ starts increasing, the base voltage $V_B$ starts decreasing at a time $t_1$. Then the output signal $V_{out}$ begins decreasing. Thereby the reverse-biased voltage ($V_{out}$-$V_B$) begins increasing. The voltage difference between the base and emitter of the bipolar transistor Q1 biases the diode D1 in the forward direction. At a time $t_2$, the reverse-biased voltage becomes equal to approximately 0.8 volts, which corresponds to a voltage drop of the diode D1 in the forward direction. Therefore, the diode D1 is turned ON. Thereby, the transistor Q1 is clamped at approximately 0.8 volts. In other words, even if the base voltage quickly $V_B$ decreases, the reverse-biased voltage does not exceed a voltage of 0.8 volts. As a result, the disadvantage of the conventional B-CMOS is eliminated. It is particularly noted that the diode D1 functions to clamp the base-emitter voltage of the transistor Q1 at a voltage resulting from the forward voltage drop of the diode D1.

Figures 3, 4:
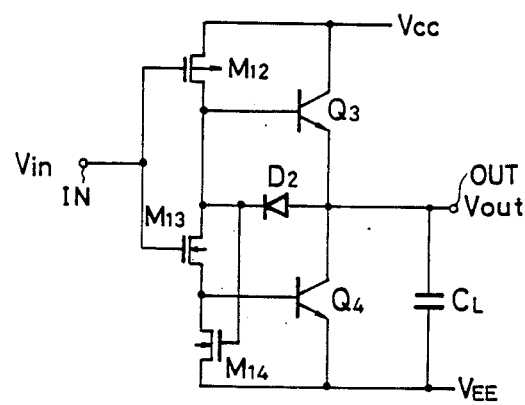
FIG. 3 is a circuit diagram of another conventional Bi-CMOS circuit.
FIG. 4 is a waveform diagram of signals in the Bi-CMOS circuit of FIG. 3.

The inventors are aware of a conventional Bi-CMOS circuit of the aforementioned second type as shown in FIG. 3 (see Japanese Laid-Open Patent Application Nos. 62-102621 and 62-169520, for example). The illustrated Bi-CMOS circuit has a diode D2 which functions differently from the diode D1 shown in FIG. 5. A diode D2 is connected between an emitter and a base of an npn-type bipolar transistor Q3. The diode D2 is provided for forming a current path for supplying a base of the bipolar transistor Q2 with a base current from the capacitive load $C_L$. When the input signal $V_{in}$ is switched to the high level, an n-channel MOS transistor M13 is turned ON. Thereby, a current passes from the capacitive load $C_L$ to the negative power source $V_{EE}$ through the diode D2, the MOS transistor M13 and an n-channel MOS transistor M14. The current also passes from the capacitive load $C_L$ to the base of the bipolar transistor Q4. This current is the base current of the bipolar transistor Q4. It is noted that the output terminal coupled with the capacitive load $C_L$ is connected to the base of the bipolar transistor Q3 through the diode D2. Therefore, the base voltage of the bipolar transistor Q3 changes depending on a change of the output signal $V_{out}$. As shown in FIG. 4(a), when the input signal $V_{in}$ is switched to the high level, the output signal $V_{out}$ decreases slowly because of the presence of the capacitive load $C_L$. Therefore, the base voltage of the bipolar transistor Q3 also decreases slowly. As a result of the above operation, the reverse-biased voltage ($V_{out}$-$V_B$) does not increase greatly.

As explained above, the base of the bipolar transistor Q3 is not connected to the negative power source $V_{EE}$ through the independent MOS transistor like M2 in FIG. 5. The MOS transistor M14 has a large impedance. Therefore, in the Bi-CMOS circuit of FIG. 3, there is no problem of the large reverse bias voltage against the emitter and the base junction of the bipolar transistor Q3.

Figure 7A:
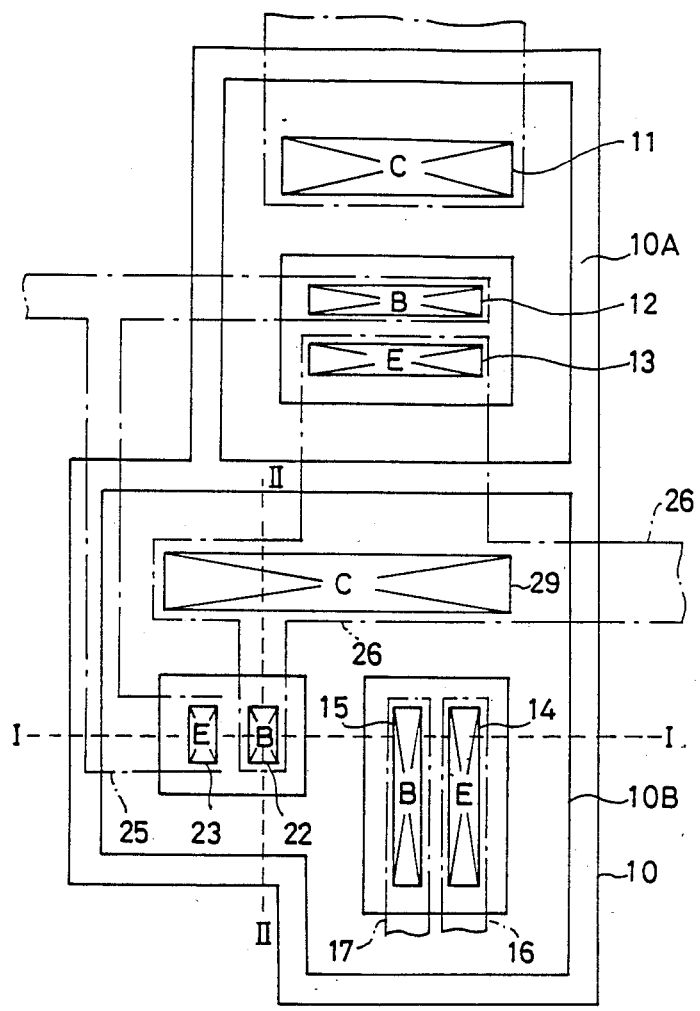
FIG. 7A is a plan view of a bipolar circuit portion in the circuit of FIG. 5.
Figure 7B:
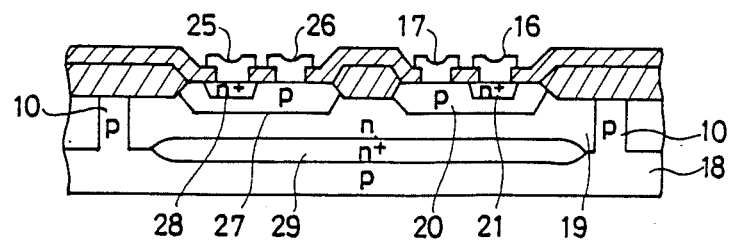
FIG. 7B is a cross sectional view taken along a line I—I in FIG. 7A.
Figure 7C:
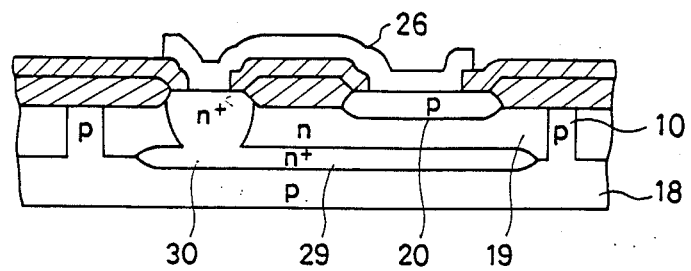
FIG. 7C is a cross sectional view taken along a line II—II in FIG. 7A.

A description is given of a device structure of the embodiment having the aforementioned circuit configuration with reference to FIGS. 7A through 7C. FIG.

7A is a plan view of a pattern of bipolar circuit portion 100 shown in FIG. 5 formed on a semiconductor chip. FIG. 7B is a cross sectional view taken along a line I—I FIG. 7A, and FIG. 7C is a cross sectional view taken along a line II—II FIG. 7A. The bipolar circuit portion 100 is formed within a substrate region surrounded by an isolation region 10 which is a p-type region of a silicon semiconductor substrate 18. In the region surrounded by the isolation region 10, there are formed the bipolar transistors Q1 and Q2, and the diode D1. A reference numeral 10A indicates a region in which the bipolar transistor Q1 is formed. In the bipolar transistor region 10A, there are formed a collector contact 11, a base contact 12, and an emitter contact 13.

A reference numeral 10B indicates a region in which the bipolar transistor Q2 and the diode D1 are formed. An emitter contact 14 and a base contact 15 of the bipolar transistor Q5 are formed in the region 10B. The base of the bipolar transistor Q2 is formed by a p-type diffusion region 20, which is formed in an n-type diffusion region 19 surrounded by the p-type isolation region 10. As shown in FIGS. 7B and 7C, an $n^+$-type buried layer 29 is formed under the n-type diffusion region 19. The emitter of the bipolar transistor Q2 is formed by an $n^+$-type diffusion region 21 formed in the p-type diffusion region 20. An interconnection layer 16 made of a metallic material such as aluminum and an alloy of aluminum and silicon, is in contact with the $n^+$-diffusion region 21. Similarly, an interconnection layer 17 is in contact with the p-type diffusion region 20.

In the present embodiment, the diode D1 shown in FIG. 5 is constructed by an npn bipolar transistor Q5, as shown in FIG. 8. A base and a collector of the bipolar transistor Q5 are mutually connected. Turning to FIGS. 7A through 7C, a base contact 22 and an emitter contact 23 of the bipolar transistor Q5 are formed in the region 10B. The base of the bipolar transistor Q5 is formed by a p-type diffusion region 27 formed in the n-type diffusion region 19. The emitter of the bipolar transistor Q5 is formed by an $n^+$-type diffusion region 28 formed in the p-type diffusion region 27. An interconnection layer 25 is in contact with the $n^+$-type diffusion region 28. An interconnection layer 26 is in contact with the p-type diffusion region 27. The interconnection layer 25 is also in contact with the base of the bipolar transistor Q1. A reference numeral 29 indicates a collector contact of the bipolar transistors Q2 and Q5. As shown in FIG. 7C, the collectors of the transistors Q2 and Q5 are common by an $n^+$-type diffusion region 30 formed in the n-type diffusion region 19. As shown in FIG. 7A, the interconnection layer 26 includes the emitter contact of the bipolar transistor Q1, the base contact 22 of the bipolar Q5, and the collector contact 29 of the bipolar transistors Q2 and Q5.

As described above, the collector of the bipolar transistor Q5 which functions as the diode D1, is formed in common with the collector of the bipolar transistor Q2. Further, the collector region of the $n^+$-type diffusion region 30 is formed in the region surrounded by the isolation region 10. Moreover, the diode D1 may be formed by a diode having a small current capacity. From these regions, the bipolar transistor Q5 can be formed with a slight increase of the pattern area. Additionally, parasitic capacitance is reduced.

Figure 9:
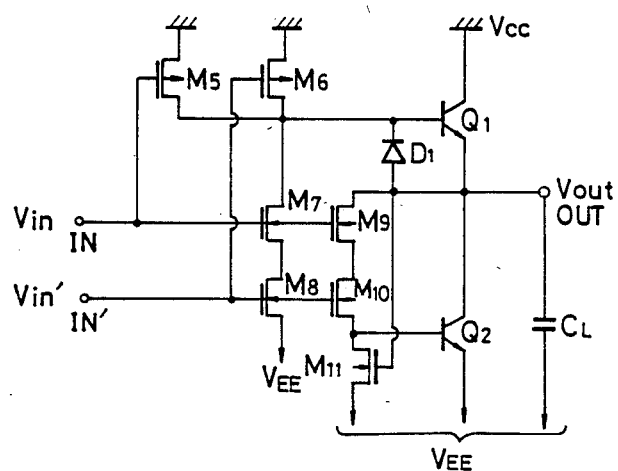
FIG. 9 is a circuit diagram of a second preferred embodiment of the present invention.

FIG. 9 is a circuit diagram of a two-input NAND gate of a second embodiment of the present invention. The NAND gate includes p-channel MOS transistors M5 and M6, and n-channel MOS transistors M7 through M11. Two input signals $V_{in}$ and $V_{in}'$ are applied to gates of the respective MOS transistors M7 and M8. The output signal $V_{out}$ is output from a node at which a drain of the MOS transistor M9 and a gate of the MOS transistor M11, and the anode of the diode D1 are mutually connected. The diode D1 is connected between the emitter and collector of the bipolar transistor Q1. When the input signals $V_{in}$ and $V_{in}'$ are switched to the low level, the base voltage $V_B$ of the bipolar transistor Q1 quickly decreases to the negative power source voltage $V_{EE}$. At this time, the current derived from the charge stored in the capacitive load $C_L$ flows to the negative power source $V_{EE}$ through the diode D1, and the MOS transistors M7 and M8. Therefore, the base-emitter voltage of the bipolar transistor Q1 is clamped at the anode-cathode forward voltage of the diode D1. The positive power source voltage $V_{CC}$ is ground level, and the negative power source voltage is a negative voltage level.

The present invention is not limited to the aforementioned embodiments, and variations and modifications may be made without departing from the scope of the present invention.

What is claimed is:

1. A bipolar-complementary metal oxide semiconductor circuit comprising:
   first and second power sources;
   logic means including first and second metal oxide semiconductor (MOS) transistors serially connected between said first and second power sources at a connection point, gates of said first and second MOS transistor connected to receive an input signal;
   a first bipolar transistor having a collector coupled to said first power source, having a base coupled to the connection point between said first and second MOS transistors, and having an emitter;
   a second bipolar transistor having an emitter coupled to said second power source, having a collector coupled to the emitter of said first bipolar transistor and used as an output terminal of the circuit, and having a base;
   a third MOS transistor connected between the base of said second bipolar transistor and said output terminal of the circuit, said third MOS transistor having a gate receiving said input signal; and
   a diode having an anode connected to the emitter of said first bipolar transistor and a cathode connected to the base of said first bipolar transistor.

2. A bipolar-complementary metal oxide semiconductor circuit as claimed in claim 1, wherein when the input signal is switched from a low level to a high level, a current passes from the output terminal to the second power source through said diode and said second MOS transistor.

3. A bipolar-complementary metal oxide semiconductor circuit as claimed in claim 1, wherein said diode comprises a bipolar transistor having a base, emitter and collector, the anode of said diode being the mutually connected collector and base of said bipolar transistor, and the cathode of said diode being the emitter of said bipolar transistor.

4. A bipolar-complementary metal oxide semiconductor circuit as claimed in claim 3, wherein the collector of said bipolar transistor of said diode and the collector of said first bipolar transistor are commonly formed by an impurity diffusion region formed in a semiconductor substrate.

5. A bipolar-complementary metal oxide semiconductor circuit as claimed in claim 1, further comprising a fourth MOS transistor connected between said output terminal of the circuit and said second power source.

6. A bipolar-complementary metal oxide semiconductor circuit connected to positive and negative power sources, comprising:
   a first transistor having a collector connected to the positive power source, having a base and having an emitter;
   a second transistor having a collector connected to the emitter of said first transistor, having an emitter connected to the negative power source, and having a base;
   a diode having an anode connected to the emitter of said first transistor and a cathode connected to the base of said first transistor;
   a first metal oxide semiconductor (MOS) transistor having a source connected to the positive power source, having a gate, and having a drain connected to the connection point of the base of said first transistor and said cathode of said diode;
   a second MOS transistor having a drain connected to the drain of said first MOS transistor, having a source connected to the negative power source and having a gate connected to the gate of said first MOS transistor, the gates of said first and second MOS transistors receiving an input signal;
   a third MOS transistor having a drain, having a gate connected to the gates of said first and second MOS transistors and for receiving the input signal, and having a source connected to the base of said second transistor; and
   a fourth MOS transistor having a drain connected to the source of said third MOS transistor, having a gate connected to the drain of said third MOS transistor and having a source connected to the negative power source, said fourth MOS transistor discharging a parasitic base capacitance of said second bipolar transistor.

7. A bipolar-complementary metal oxide semiconductor circuit as set forth in clam 6, wherein said diode comprises an NPN bipolar transistor having a base and a collector connected together, and having an emitter, the emitter being connected to the base of said first bipolar transistor and the common connection of said base and collector being connected to the emitter of said first bipolar transistor.

8. A bipolar-complementary metal oxide semiconductor (MOS) circuit having a positive power source voltage and a negative power source voltage, comprising:
   a first bipolar transistor having a collector connected to the positive power source, having a base, and having an emitter;
   a second bipolar transistor having a collector connected to the emitter of said first bipolar transistor, having an emitter connected to the negative power source, and having a base;
   a diode having a cathode connected to the base of said first bipolar transistor and having an anode connected to the emitter of said first bipolar transistor;
   a NAND gate connected to the positive power source and the base of said first bipolar transistor;
   a first MOS transistor having a gate connected to receive an input signal, having a drain connected to said NAND gate and having a source;
   a second MOS transistor having a drain connected to the source of said first MOS transistor, having a gate for receiving a second input signal and having a source connected to the negative power source;
   a third MOS transistor having a drain connected to the connection between the anode of said diode and the emitter of said first bipolar transistor, having a gate connected to the gate of said first MOS transistor and having a source;
   a fourth MOS transistor having a drain connected to the source of said fourth MOS transistor, having a gate connected to the gate of said second MOS transistor and having a source connected to the base of said second bipolar transistor; and
   a fifth MOS transistor having a drain connected to the connection point of the source of said fourth MOS transistor and the base of said second bipolar transistor, having a gate connected to the connection of the anode of said diode and the drain of said third MOS transistor, and having a source connected to the negative power source.

9. A bipolar-complementary metal oxide semiconductor circuit as set forth in claim 8, wherein said NAND gate comprises:
   a sixth MOS transistor having a source connected to the positive power source, having a gate connected to receive the first input signal, and having a drain connected to the base of said first bipolar transistor; and
   a seventh MOS transistor having a source connected to the positive power source, having a gate connected to receive the second input signal and to the gate of said second MOS transistor and having a drain connected to the connection of said sixth MOS transistor and the base of said first bipolar transistor and the drain of said first MOS transistor.

10. A bipolar-complementary metal oxide semiconductor circuit as set forth in claim 9, wherein said positive power source is ground level.

* * * * *